United States Patent
Hauenstein et al.

(10) Patent No.: US 7,208,829 B2
(45) Date of Patent: Apr. 24, 2007

(54) SEMICONDUCTOR COMPONENT

(75) Inventors: Henning Hauenstein, El Segundo, CA (US); Rainer Topp, Reutlingen (DE); Jochen Seibold, Tuebingen (DE); Dirk Balszunat, Tuebingen (DE); Stefan Ernst, Ostfildern (DE); Wolfgang Feiler, Reutlingen (DE); Thomas Koester, Reutlingen (DE); Stefan Hornung, Leinfelden-Echterdingen (DE); Dieter Streb, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/514,171

(22) PCT Filed: Feb. 10, 2003

(86) PCT No.: PCT/DE03/00376

§ 371 (c)(1),
(2), (4) Date: Jun. 2, 2005

(87) PCT Pub. No.: WO03/096415

PCT Pub. Date: Nov. 20, 2003

(65) Prior Publication Data

US 2006/0163648 A1 Jul. 27, 2006

(30) Foreign Application Priority Data

May 11, 2002 (DE) ............... 102 21 082

(51) Int. Cl.
*H01L 29/72* (2006.01)
(52) U.S. Cl. .............. 257/690; 257/328; 257/703; 257/705; 257/750; 257/762; 257/773
(58) Field of Classification Search ............. 257/328, 257/690, 703, 705, 750, 762, 773
See application file for complete search history.

(56) References Cited

U.S. PATENT DOCUMENTS

| 4,419,810 | A | 12/1983 | Riseman |
| 5,313,088 | A | 5/1994 | Takahashi et al. |
| 6,072,240 | A | 6/2000 | Ohara et al. |
| 6,420,755 | B1 * | 7/2002 | Bloos et al. ............. 257/328 |
| 6,707,138 | B2 * | 3/2004 | Crowley et al. ......... 257/676 |
| 2002/0171134 | A1 * | 11/2002 | Choi .......................... 257/678 |

FOREIGN PATENT DOCUMENTS

| FR | 2 817 907 | 4/2002 |
| WO | 99 26295 | 5/1999 |

* cited by examiner

*Primary Examiner*—Edward Wojciechowicz
(74) *Attorney, Agent, or Firm*—Kenyon & Kenyon LLP

(57) ABSTRACT

A semiconductor component that is able to be produced simply, quickly, and yet reliably and that usable for power applications, and including a semiconductor chip, a lower, first main electrode layer formed on a first side of the semiconductor chip, a lower control electrode layer formed on the first side, an insulation layer formed on the first side between the lower first main electrode layer and the lower control electrode layer and which partly covers the lower first main electrode layer, an upper first main electrode layer which is formed on the lower first main electrode layer, an upper control electrode layer which is formed on the lower control electrode layer and the insulation layer and extends on the insulation layer partially above the lower first main electrode layer, and a second main electrode layer formed on a second side of the semiconductor chip.

7 Claims, 2 Drawing Sheets

SEMICONDUCTOR COMPONENT

FIELD OF THE INVENTION

The present invention relates to a semiconductor component that may be used for power applications.

BACKGROUND INFORMATION

In power components, in particular power transistors, having a vertical layout, a first main electrode metallization and the control electrode metallization are formed on a first side (top side) of the semiconductor chip, and the second main electrode metallization is formed on a second side (back side) of the semiconductor chip. Soldering to a connection device or a connection grid—as a rule a substrate or tape (flexible film)—may be done quickly, simply and economically for the larger, second main electrode metallization, for instance a source metallization, with a surface area of 20 mm$^2$ by interposing a large-area solder foil or by a solder paste imprint onto the connection grid. The control electrode metallization is embodied as very small, with a surface area of 1 mm$^2$ or less, for instance. To assure adequate positioning precision in the solder coating, the solder must therefore at least be applied to the patterned front side of the semiconductor chip in advance, in an additional laborious, complex and expensive process step in the form of solder bumps. After that, the connection devices are soldered to the semiconductor chip incorporated between them in a soldering oven.

A plurality of semiconductor chips may be placed laterally next to one another and soldered between common connection devices. U.S. Pat. No. 6,072,240 discusses one such semiconductor component and the method for its production, in which transistors in reverse arrangement are soldered between common substrates.

The semiconductor component of the present invention and the exemplary method of the present invention by comparison have the advantage in particular that relatively simple, fast and nevertheless reliable production of the semiconductor component is made possible. By embodying an insulation layer and additional metal layers or metal planes on the front side of the semiconductor chip, it is possible to dispense with the additional step of applying solder bumps. According to one embodiment, in particular, a semiconductor component configuration including at least one semiconductor component of the exemplary embodiment and/or exemplary method of the present invention and at least one connection device soldered to it is created.

According to the exemplary embodiment and/or exemplary method of the present invention, on the first side of the semiconductor chip an insulation layer that partially covers the lower, first main electrode layer—already used in conventional components—is thus applied between the first main electrode layer and the gate electrode layer. Next, according to the exemplary embodiment and/or exemplary method of the present invention, upper electrode layers or metal planes are applied to the lower electrode layers of the first side; the upper control electrode layer or gate electrode layer may be embodied with a substantially larger area than the lower control electrode layer, by forming it over a larger region of the insulation layer, and in particular even above the overlapped region of the lower, first main electrode layer. Thus with the embodiment of a suitable insulation layer, a desired dimensioning of the upper electrode layers or upper metal planes, which have a larger area for the solder to be applied, is attainable. As a result, the solder—as is also true on the second side or underside of the semiconductor chip—may be provided using an interposed solder foil or by a solder paste applied, for instance imprinted, onto the connection device.

The resultant graduations in the electrode layers, in particular inside the upper control electrode layer as well, are in principle already evened out by the solder that melts out in the assembly process; in addition, a supplementary method for planarizing the chip surfaces may be performed, for instance by partial insertion of one or more intermediate oxide layers.

Both ceramic substrates and flexible films or tapes, having suitably dimensioned conductive terminal regions, may be used as the connection device or connection grid. In particular, one or two DBC (direct bonded copper) substrates, which include(s) one further metal layer on the outside of the component formed according to the exemplary embodiment and/or exemplary method of the present invention, may be used.

According to the exemplary embodiment and/or exemplary method of the present invention, in particular, two or more semiconductor chips side by side may be soldered between two connection devices. For instance, two or more transistors may be soldered in reverse disposition, allowing for the formation of a contacting or connection of the electrodes of the transistors by the conductive terminal regions on the connection devices.

According to the exemplary embodiment and/or exemplary method of the present invention, not only field effect transistors may be created but also other semiconductor components, such as bipolar transistors or thyristors.

DETAILED DESCRIPTION

Figure 1:
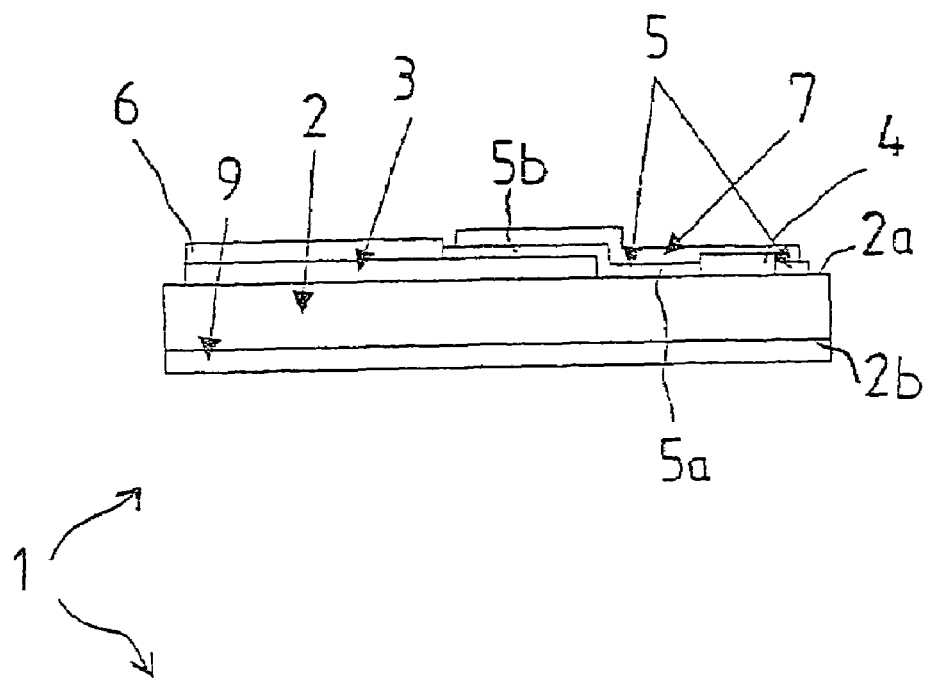
FIG. 1 shows a sectional view of a power transistor used in the semiconductor component of the invention.
Figure 2:
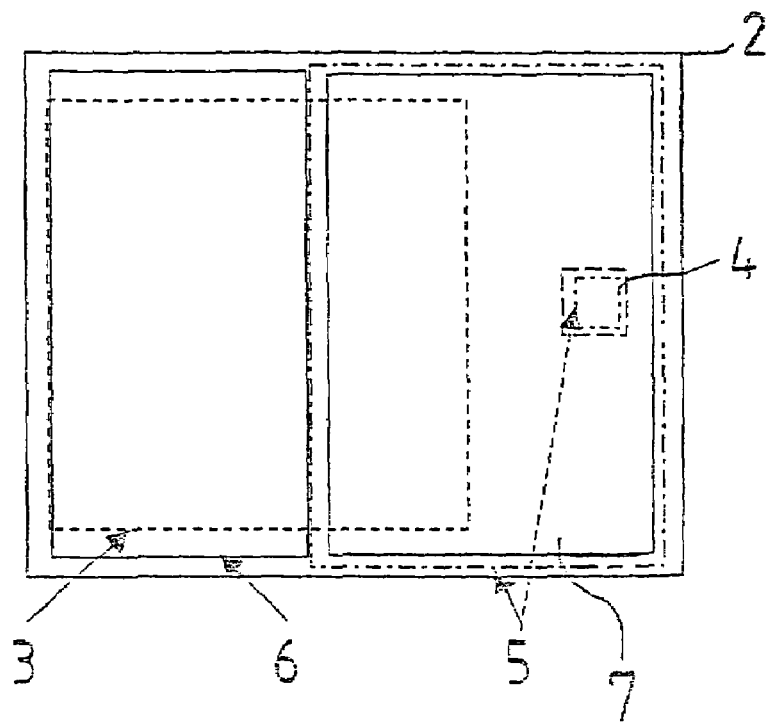
FIG. 2 shows a plan view of the power transistor in FIG. 1.

A power transistor 1 as shown in FIGS. 1 and 2 includes a silicon chip 2 of vertical layout, in which doped regions, not further shown, are patterned. On a top side 2a of silicon chip 2, above a source region, a lower source metal layer 3 is applied as a lower, first main electrode layer. Laterally spaced apart from it, a lower gate metal layer 4 is applied as a lower control electrode layer. On the second side or underside 2b of silicon chip 2, a drain metal layer 9 is applied as a second main electrode layer over a drain region.

According to the invention, an insulation layer 5—for instance of silicon dioxide—is applied to top side 2a in such a way that with its partial region 5a, it extends between lower source metal layer 3 and lower gate metal layer 4 and also, with its partial region 5b, covers a region of lower source metal layer 3. The area of lower source metal layer 3 that is left exposed is covered by an upper source metal layer 6, which laterally adjoins insulation layer 5. An upper gate metal layer 7 is applied to insulation layer 5 and covers partial regions 5a and 5b as well as lower gate metal layer 4. In a subsequent method step, two power transistors 11 and 12, having the layout shown in FIGS. 1, 2 and with corresponding reference numerals are positioned in reverse disposition, laterally spaced apart from one another, between a first DBC substrate 30 and a second DBC substrate 40. Each DBC substrate 30, 40, on its inner side, that is, the side oriented toward semiconductor chips 11, 12, includes a first copper layer 32, 42, acting as a conductive terminal layer, which is opposite upper source metal layers 16, 26. Second copper layers 33, 43 are also provided on the inner sides of DBC substrates 30, 40 and are positioned such that alternating copper layers 33 and 43 are opposite drain metal layers 29 and 19 and upper gate metal layers 17 and 27, respectively. One solder foil 35 and 45 is positioned between each upper source metal layer 16 and 26 and respective first copper layer 32, 42. Correspondingly, solder foils 36 and 46 are positioned between upper gate metal layer 17 and 27 and second copper layer 33 and 43, respectively, and solder foils 47 and 37 are positioned between drain metal layers 19 and 29 and second copper layers 33 and 43, respectively. Additional copper layers 34, 44 are formed on the outer sides of DBC substrates 30, 40.

Figure 3:
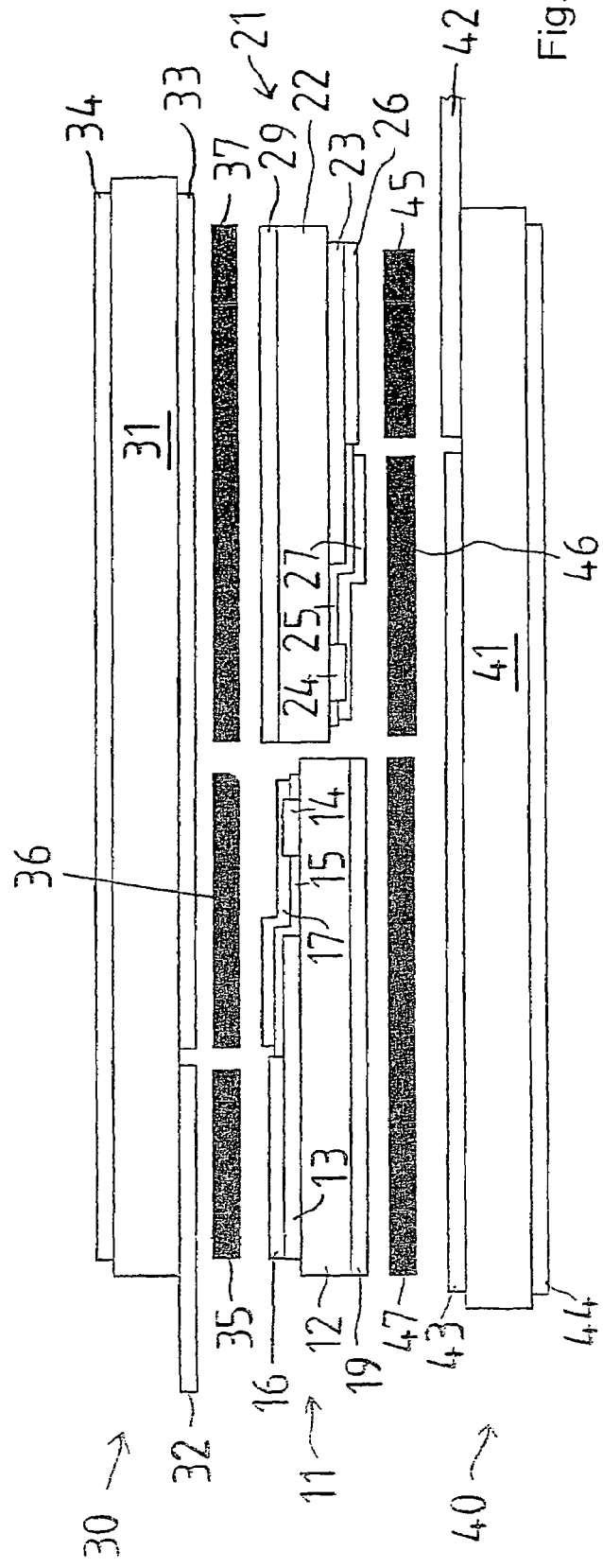
FIG. 3 shows a sectional view of a component prior to soldering.
Figure 4:
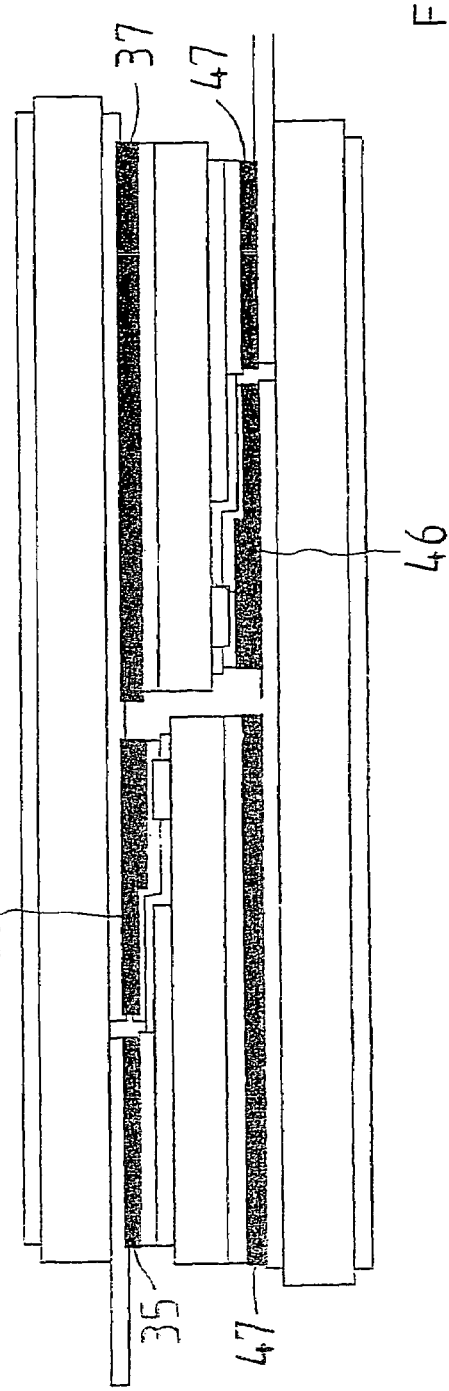
FIG. 4 shows a sectional view of the component in FIG. 3 after the soldering.

The configuration shown in FIG. 3 is subsequently compressed and heated in a soldering oven, producing the component shown in FIG. 4. In the process, the solder of solder foils 36 and 46 has distributed itself in such a way that the graduations in upper gate metal layers 17 and 27 have been leveled off.

What is claimed is:

1. A semiconductor component arrangement, comprising:
    a semiconductor chip;
    a lower, first main electrode layer formed on a first side of the semiconductor chip;
    a lower control electrode layer formed on the first side;
    an insulation layer formed on the first side between the lower, first main electrode layer and the lower control electrode layer and which partly covers the lower, first main electrode layer;
    an upper first main electrode layer formed on the lower, first main electrode layer;
    an upper control electrode layer formed on the lower control electrode layer and the insulation layer and extends on the insulation layer partly above the lower, first main electrode layer;
    a second main electrode layer formed on a second side of the semiconductor chip;
    a first connection device having a first conductive terminal region soldered to the upper, first main electrode layer of the semiconductor component via a first solder layer;
    a third conductive terminal region soldered to the upper control electrode layer of the semiconductor component via a third solder layer; and
    a second connection device having a second conductive terminal region soldered to the second main electrode layer of the semiconductor component via a second solder layer;
    wherein at least one of the first connection device and the second connection device is a ceramic substrate having metal layers as conductive terminal regions on both sides, the ceramic substrates being DBC substrates.

2. The semiconductor component of claim 1, wherein the first main electrode layers form a source electrode, the control electrode layers form a gate electrode, and the second main electrode layer forms a drain electrode.

3. The semiconductor component of claim 1, further comprising:
    an intermediate oxide layer, for leveling a height, between the lower, first main electrode layer and the lower control electrode layer.

4. The semiconductor component arrangement of claim 1, further comprising:
    at least two semiconductor components provided, in reverse orientation, between the first connection device and the second connection device;
    wherein:
        the second main electrode layer of the first semiconductor component and the upper control electrode layer and the upper first main electrode layer of the second semiconductor component are soldered to terminal regions of the second connection device via solder layers, and
        both the upper first main electrode layer and the upper control electrode layer of the first semiconductor component and the second main electrode layer of the second semiconductor component are soldered to terminal regions of the second connection device via solder layers.

5. The semiconductor component arrangement of claim 4, wherein:
    the second main electrode layer of the first semiconductor component and the upper control electrode layer of the second semiconductor component are soldered to a same terminal region of the second connection device via solder layers, and
    the upper control electrode layer of the first semiconductor component and the second main electrode layer of the second semiconductor component are soldered to the same terminal region of the first connection device via solder layers.

6. The semiconductor component arrangement of claim 1, wherein at least some of the solder layers are at least one of solder foils and solder paste imprints.

7. The semiconductor component arrangement of claim 1, wherein all of the solder layers are at least one of solder foils and solder paste imprints.

* * * * *